United States Patent
Bang et al.

[11] Patent Number: 5,948,958
[45] Date of Patent: Sep. 7, 1999

[54] METHOD AND APPARATUS FOR VERIFYING THE CALIBRATION OF SEMICONDUCTOR PROCESSING EQUIPMENT

[75] Inventors: Won Bang, San Jose; Chen-An Chen, Sunnyvale, both of Calif.

[73] Assignee: Applied Materials, Inc., Santa Clara, Calif.

[21] Appl. No.: 09/144,722

[22] Filed: Sep. 1, 1998

[51] Int. Cl.$^6$ ........................................ G01F 1/00
[52] U.S. Cl. ........................................ 73/1.36
[58] Field of Search ............ 73/1 R, 1.16, 1.36

Primary Examiner—Robert Raevis
Attorney, Agent, or Firm—Valerie Dugan

[57] ABSTRACT

A semiconductor processing equipment calibration verification procedure is provided that does not rely on pressure rises from laboratory reference chambers and that is insensitive to in-chamber variations that affect processing gas pressure rise but do not affect the underlying process. A baseline pressure rise ratio is computed based on an inert gas pressure rise and a processing gas pressure rise produced when an inert gas and a processing gas, respectively, are flowed into a processing chamber. Subsequent, preferably periodic, calibration verification procedures are performed and new pressure rise ratios are computed. When a new pressure rise ratio differs from the baseline pressure rise ratio by more than a predetermined amount, the calibration of the semiconductor processing equipment is rejected.

21 Claims, 5 Drawing Sheets

METHOD AND APPARATUS FOR VERIFYING THE CALIBRATION OF SEMICONDUCTOR PROCESSING EQUIPMENT

FIELD OF THE INVENTION

The present invention generally relates to the field of semiconductor processing equipment and more specifically relates to a method and apparatus for verifying the calibration of semiconductor processing equipment.

BACKGROUND OF THE INVENTION

During semiconductor wafer processing such as deposition, epitaxial growth, etching and the like, precise control over the concentration of each employed processing gas is required. Depending on the particular process, processing gas concentration can control deposited film thickness and doping level, epitaxial film stoichiometry, etch rate, etc. Additionally, precise processing gas control must be maintained over many processing runs to prevent wafer-to-wafer variations and to allow semiconductor device fabrication in mass.

Processing gas concentration normally is controlled via a flow regulator, such as a mass flow controller. The flow regulator controls processing gas concentration within a processing chamber by controlling the processing gas flow rate into the processing chamber. As used herein, a processing gas includes gasses, vaporized processing liquids and the like, and a processing gas flow regulator includes any flow regulator (e.g., flow meter, mass flow controller, etc.) that affects processing gas flow rate (e.g., a gas flow regulator, a processing liquid flow regulator, etc.).

To ensure accurate flow rates, and thus accurate processing gas concentration, typically each processing gas flow regulator is subjected to a one-time, labor intensive calibration procedure. For example, a conventional calibration procedure for a deposition process might include:

1. selecting a "best guess" flow regulator setting for a desired film thickness;
2. depositing a film with the selected flow regulator setting;
3. measuring the film thickness actually deposited;
4. adjusting the flow regulator setting to compensate for any error between the actual film thickness and the desired film thickness; and
5. repeating steps 1–4 until the actual film thickness is within an acceptable tolerance of the desired film thickness.

Once the proper flow regulator setting is determined, the flow regulator is deemed calibrated, and subsequent flow rates are selected based on the determined flow regulator setting.

Because the calibration procedure is a lengthy, iterative process involving substantial chamber downtime, flow regulators typically are calibrated in the manner described above only once. Thereafter, a less precise re-calibration process is employed periodically (e.g., daily).

One conventional method for re-calibrating a production chamber's flow regulator is to select a standard processing gas flow rate with the regulator and then to measure the rise in chamber pressure that results from the selected flow rate. This pressure rise is compared to an expected pressure rise measured on a laboratory chamber having a flow regulator of known accuracy. Any deviation between the production chamber's pressure rise and the laboratory chamber's pressure rise is attributed to an inaccuracy within the production chamber's flow regulator, and the calibration of the production chamber's flow regulator is adjusted until the production chamber's pressure rise matches the laboratory chamber's pressure rise.

A problem exists with such conventional re-calibration procedures because they are based on the assumption that, but for an inaccuracy in the production chamber's flow regulator, the pressure rise within the production chamber will equal the pressure rise within the laboratory chamber. However, this assumption is flawed because the assumption neglects other reasons for a difference in pressure rise between the production chamber and the laboratory chamber. Different chamber specifications between the production chamber and the laboratory chamber (i.e., "between-chamber" variations) such as different pump speeds, different throttle valve leakage rates and different foreline conductances can cause the pressure rise within the production chamber to differ from the pressure rise within the laboratory chamber.

Additionally, variations within the production chamber itself (i.e., "in-chamber" variations) such as within tolerance changes in leak rate, pump speed, throttle valve leakage, degassing/absorption properties, etc., can cause the production chamber's pressure rise to differ from the laboratory chamber's pressure rise. However, conventional re-calibration procedures treat any difference in pressure rise as a production chamber flow regulator inaccuracy, and thus often result in erroneous adjustments in flow rate. When the flow regulator is erroneously re-calibrated, processing gas concentration within the production chamber is altered and actual processing results deviate from desired processing results (e.g., different deposited film thickness or doping level, improper stoichiometry, over/under etching, etc.)

A need therefore exists for a procedure for ensuring flow regulator calibration independent of both between-chamber variations and in-chamber variations that affect pressure rise. Such a procedure should be economical and expedient, requiring minimal chamber downtime

SUMMARY OF THE INVENTION

To meet the needs of the prior art, an inventive calibration verification procedure is provided that relies entirely on pressure rises within the production chamber, making between-chamber variations irrelevant. A pressure rise ratio is computed based on an inert gas pressure rise and a processing gas pressure rise within the production chamber; a pressure rise ratio within a selected tolerance verifies calibration accuracy. Because the pressure rise measurements are performed within the same chamber and then are ratioed, the inventive calibration verification procedure is insensitive to in-chamber variations that similarly affect inert gas pressure rise and processing gas pressure rise, but that have little affect on the process performed within the production chamber (e.g., small changes in leak rate, pumping speed, throttle valve leakage, degassing/absorption properties, etc.).

Specifically, with use of the present invention semiconductor processing equipment, such as the flow regulator of a processing chamber, is calibrated by conventional methods. Thereafter, the processing chamber is pumped to a base pressure, an inert gas (e.g., helium) is flowed into the chamber, and the processing chamber's throttle valve is adjusted to establish a desired background pressure.

The flow rate of the inert gas is increased by a selected amount and the pressure rise from the increased inert gas flow is measured. The flow rate of the inert gas then is reduced to its original rate so that the chamber pressure drops to the background pressure. Next, the processing gas is introduced at a fixed flow rate and the rise in chamber pressure from the processing gas flow is measured. A ratio of the processing gas pressure rise to the inert gas pressure rise (i.e., the pressure rise ratio) then is computed.

The initial pressure rise ratio is used as a standard or baseline by which the calibration of the flow regulator is verified. That is, the inventive calibration verification procedure is repeated periodically and a new pressure rise ratio is computed for each verification procedure. Each new pressure rise ratio is compared to the baseline pressure rise ratio.

Any in-chamber variations cause a similar change in both the processing gas pressure rise and in the inert gas pressure rise, and the pressure rise ratio remains substantially constant. Accordingly, if a highly reliable flow regulator such as a mass flow controller is employed to deliver the inert gas, the pressure rise ratio will change only if the calibration of the processing gas flow regulator changes such that the amount of processing gas which flows into the processing chamber during the verification procedure differs from the amount flowed when the baseline pressure rise ratio was established. If the pressure rise ratio changes by more than a set amount (e.g., 4%) from the baseline pressure rise ratio, the flow regulator is replaced, the new flow regulator is calibrated and the above verification procedure is repeated to establish a new baseline pressure rise ratio.

The inventive calibration verification procedure advantageously relies only on pressure rises that occur within the processing chamber. Thus, between-chamber variations that affect pressure rise are irrelevant. Further, small variations within the processing chamber which affect pressure rise but which have little affect on device processing within the processing chamber do not cause the inventive calibration verification procedure to erroneously signal that a flow regulator should be replaced. For instance, if the leak rate, pumping speed, throttle valve leakage rate, or degassing/absorption properties of the processing chamber change slightly, both the processing gas pressure rise and the inert gas pressure rise will be similarly affected, and the pressure rise ratio will remain substantially constant. Additionally, the calibration verification procedure can be performed rapidly, with little chamber downtime.

The inventive calibration verification procedure preferably is performed using existing equipment, and may be automated or manual. Gross chamber variations (e.g., large changes in leak rate, pumping speed, throttle valve leakage, etc.) can be detected by larger-than-normal changes in the inert gas pressure rise or in the processing gas pressure rise.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
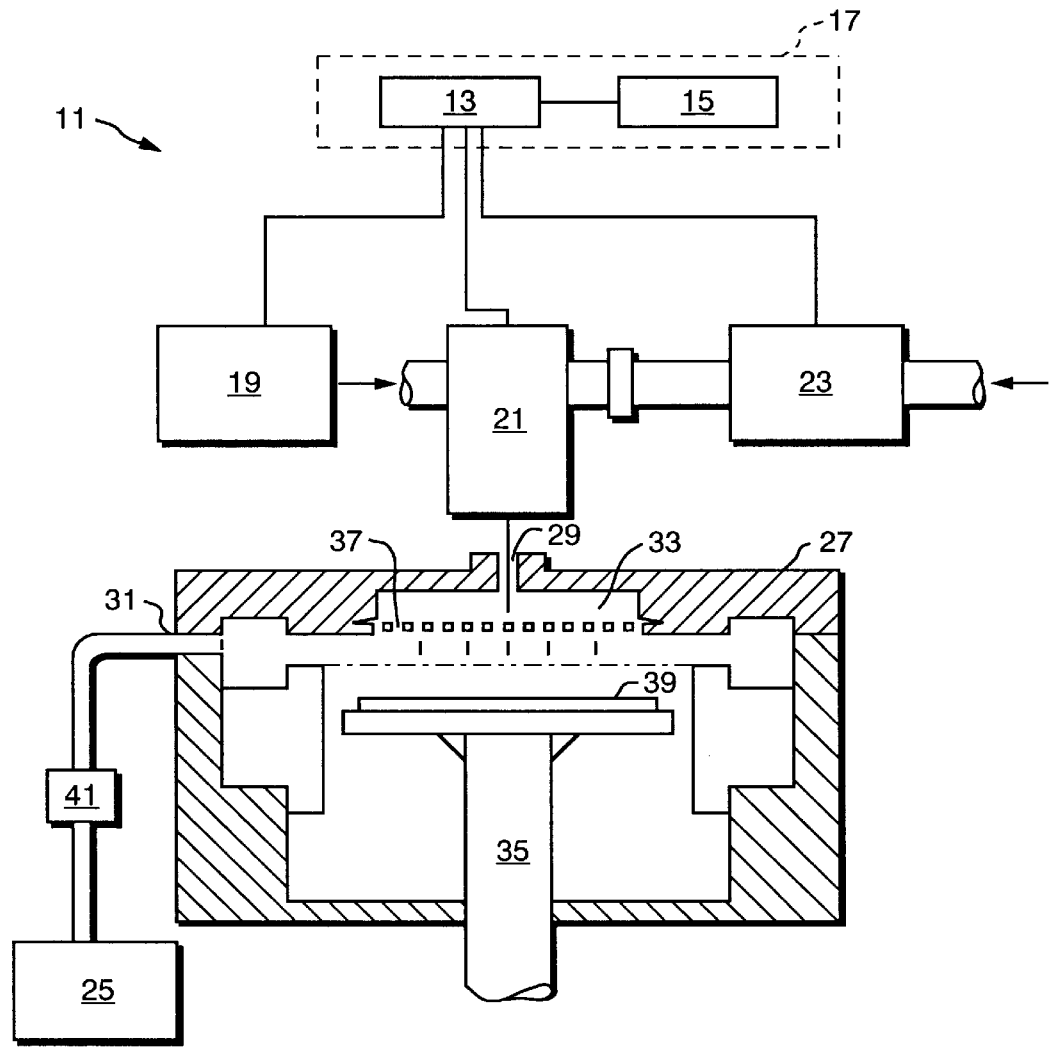
FIG. 1A is a partially cut-away, side-elevational view of a chemical vapor deposition system for performing the inventive method.

Although the inventive calibration verification procedure is useful with many types of semiconductor processing equipment, its is particularly useful when employed with a CVD system such as the CVD system 11 of FIG. 1A. FIG. 1A is a partially cut-away, side-elevational view of a chemical vapor deposition (CVD) system 11 configured in accordance with the invention. The CVD system 11 is suitable for performing silicon dioxide deposition, as well as other processes such as reflow, drive-in, etching, etc. Multiple processing steps therefore can be performed on a single substrate without removing the substrate from the CVD system 11. The CVD system 11 is described in detail in U.S. patent application Ser. No. 09/076,170, filed May 5, 1998 (AMAT No. 2590/PDD/KPU8/MBE), the disclosure of which is incorporated herein by this reference. Generally, however, the CVD system 11 comprises a processor 13 and a memory 15 contained within a controller 17; a gas supply system 19, a gas mixing box 21, a plasma generation system 23 and a vacuum system 25, each of which operatively couples the controller 17; and a chamber 27 having a gas/plasma inlet 29 along the top thereof, and an outlet 31. The chamber 27 further contains a gas distribution plate 33 and a wafer support 35.

The gas mixing box 21 is coupled to the chamber 27 via the inlet 29, which introduces gases from the gas mixing box 21 to the backside of the gas distribution plate 33. The gas distribution plate 33 has a plurality of small orifices 37 that disperse gas flowing from the gas plasma inlet 29 to a wafer 39 positioned on the wafer support 35. The vacuum system 25 is coupled to the chamber 27 via the outlet 31, and via a throttle valve 41.

Figure 1B:
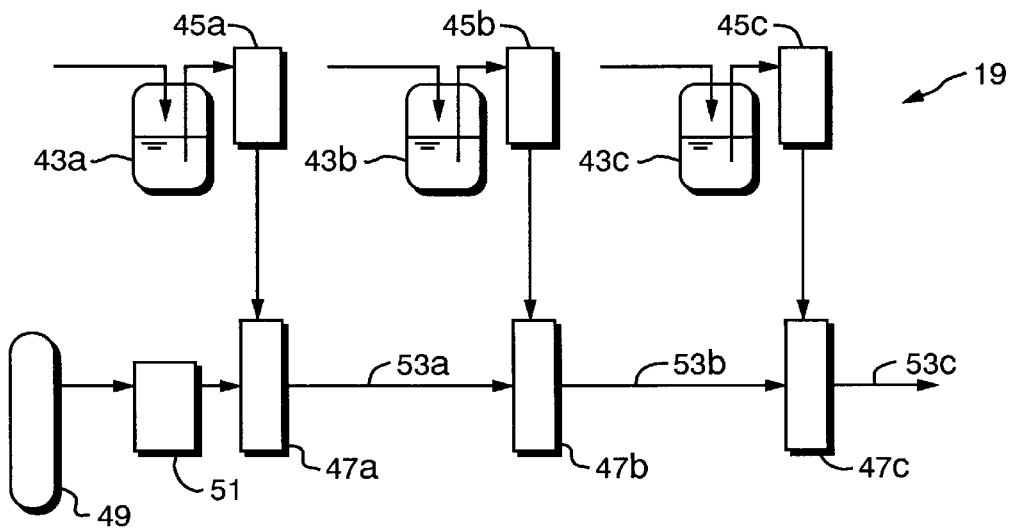
FIG. 1B is a schematic diagram of a gas delivery system for use with the chemical vapor deposition chamber of FIG. 1A.

FIG. 1B is a schematic diagram of the gas supply system 19 configured for depositing doped and undoped silicon dioxide. As is known in the art, silicon dioxide can be deposited via chemical vapor deposition on a surface of a semiconductor wafer if vaporized tetraethyl orthosilicate (TEOS) is reacted with ozone at a temperature in the range of 350° C.–600° C. Further, the addition of vaporized triethylphosphate (TEPO) or tetraethel borate (TEB) therewith allows the silicon dioxide to be doped p-type or n-type, respectively.

Accordingly, to affect doped and undoped silicon dioxide deposition, the gas supply system 19 comprises a TEB source 43a coupled to a first liquid flow meter 45a, a TEOS source 43b coupled to a second liquid flow meter 45b, and a TEPO source 43c coupled to a third liquid flow meter 45c. Each source of processing liquid is coupled to a source of pressurized helium (not shown).

To vaporize each processing liquid prior to entry into the chamber 27, the output of each liquid flow meter 45a–c is coupled to an input of an injection valve 47a–c, respectively. The first injection valve 47a is coupled to an inert carrier gas source (e.g., a helium source 49) via a mass flow controller 51 that accurately and very repeatably controls the flow rate of helium supplied by the helium source 49.

The helium carrier gas enters the first injection valve 47a and vaporizes any TEB processing liquid supplied to the first injection valve 47a from the first. Liquid flow meter 45a. The vaporized TEB, if any, is supplied via a first gas line 53a to the second injection valve 47b along with the helium carrier gas. At the second injection valve 47b, the helium carrier gas vaporizes any TEOS processing liquid supplied to the second injection valve 47b from the second flow meter 45b. The vaporized TEOS, if any, is supplied via a second gas line 53b to the third injection valve 47c along with any vaporized TEB and the helium carrier gas. At the third injection valve 47c, the helium carrier gas vaporizes any TEPO processing liquid supplied to the third injection valve 47c from the third flow meter 45c. The vaporized TEPO, if any, is supplied via a third gas line 53c to the gas mixing box 21 along with any vaporized TEB and TEOS, and the helium carrier gas.

Within the gas mixing box 21, the vaporized processing liquids are mixed with ozone, and the gas mixture is supplied to the gas distribution plate 33 through the inlet 29. If the wafer 39 is heated to the processing temperature (e.g., 350–600° C.), the vaporized processing liquid/ozone mixture reacts at elevated temperature wafer surfaces to affect silicon dioxide deposition on the wafer 39. The particular flow rate of each processing liquid controls the thickness (e.g., TEOS flow rate) and doping (e.g., TEB and TEPO flow rates) of the deposited silicon dioxide film. Thus, to affect deposition of silicon dioxide layers having repeatably uniform thicknesses and repeatable doping concentrations, tight control over the flow rate of each processing liquid is required.

The liquid flow meters 45a–c are controlled by the controller 17, and helium carrier gas alone, any one processing liquid and helium carrier gas mixture, or any combination of processing liquids and helium carrier gas can be supplied to the chamber 27 by selectively turning the liquid flow meters 45a–c on or off via the controller 17. The controller 17 also selects the flow rate for each processing liquid to achieve the desired film thickness and/or doping level. Each flow meter 45a–c, therefore, is calibrated (as previously described) so that the controller 17 can properly control each processing liquid's flow rate to achieve the desired film properties. Thereafter, the calibration of each flow meter 45a–c is verified by the inventive calibration verification procedure described (below) with reference to FIG. 2. In this manner, silicon dioxide films can be deposited in mass with a high degree of repeatability in film thickness and doping level.

Figure 2A:
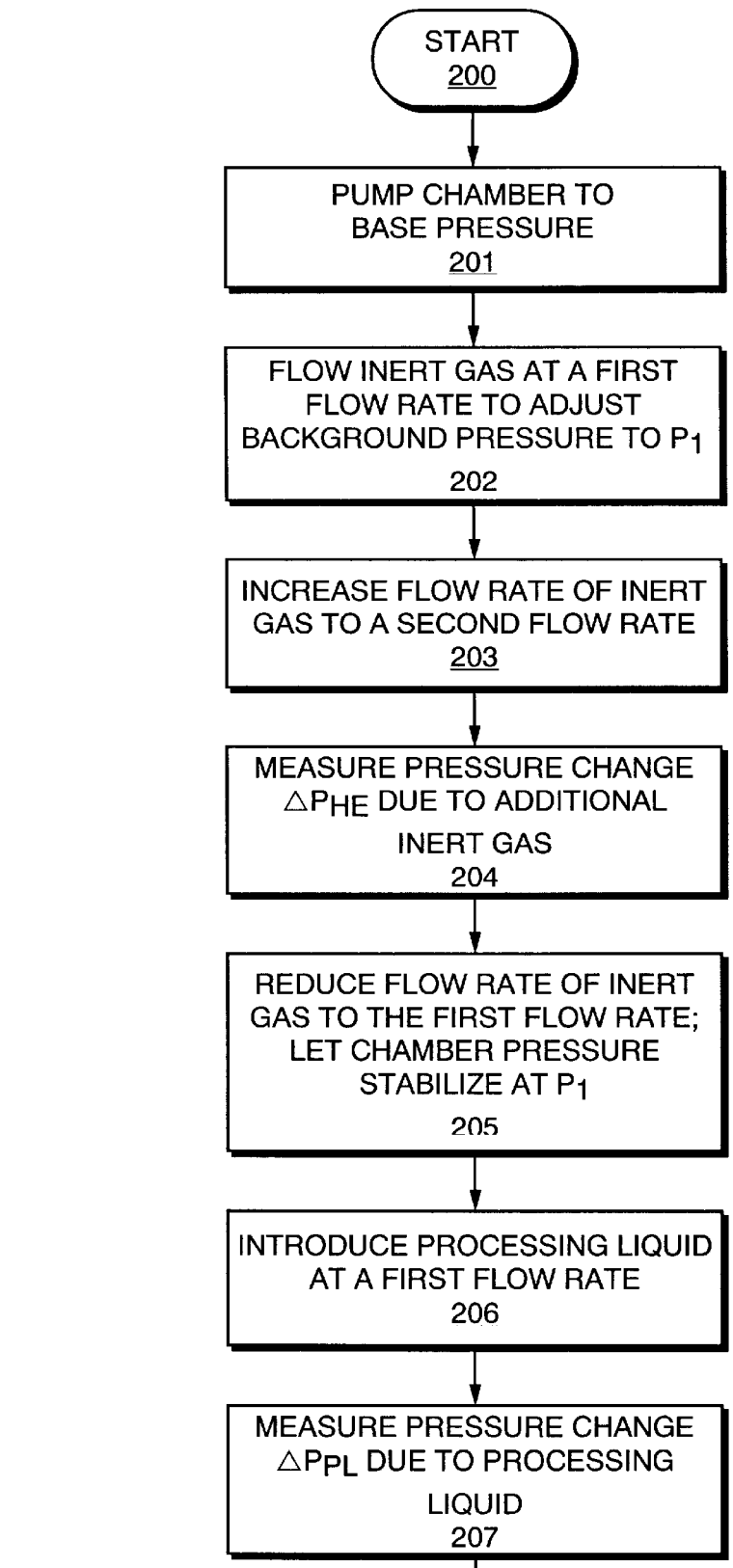
FIGS. 2A and 2B are flow charts of an inventive calibration verification procedure in accordance with the present invention.
Figure 2B:
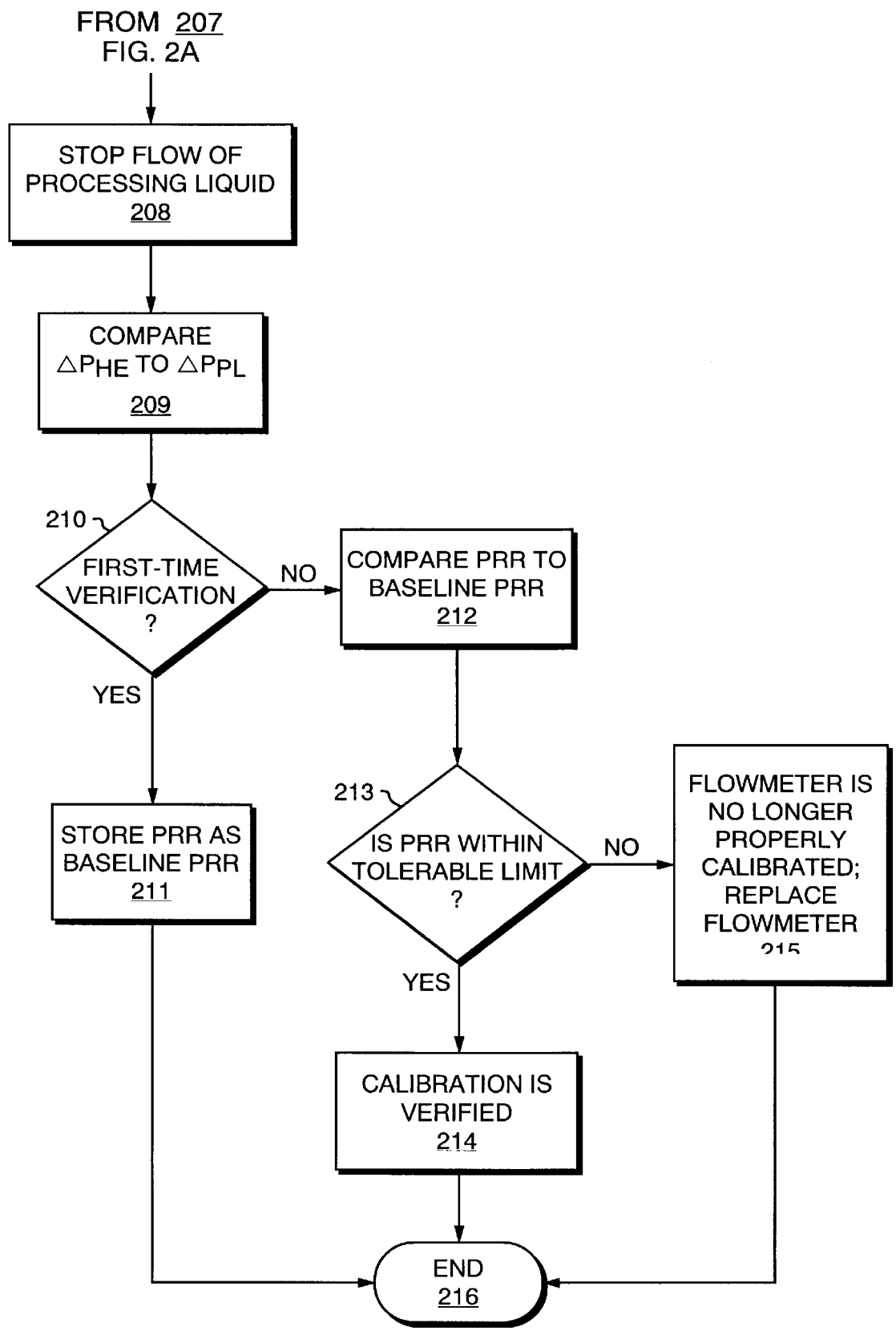

FIG. 2 is a flow chart of the inventive calibration verification procedure for verifying the calibration of each flow meter 45a–c. As the calibration verification procedure is the same for each flow meter, the calibration verification procedure will be explained only with reference to the first flow meter 45a. To aid in the understanding of FIG. 2, a graph of chamber pressure versus time during the calibration verification procedure is provided in FIG. 3. Preferably, the memory 15 (FIG. 1A) contains a program for performing the inventive calibration verification procedure on a periodic basis (e.g., once a week). However, it will be understood that any or all parts of the inventive calibration verification procedure may be performed manually.

With reference to FIG. 2, in step 200 the inventive calibration verification procedure is executed. In step 201, the controller 17 directs the vacuum system 25 to evacuate the chamber 27 to its base pressure (e.g., about 0.3 Torr). This occurs at time $t_0$ in FIG. 3.

Figure 3:
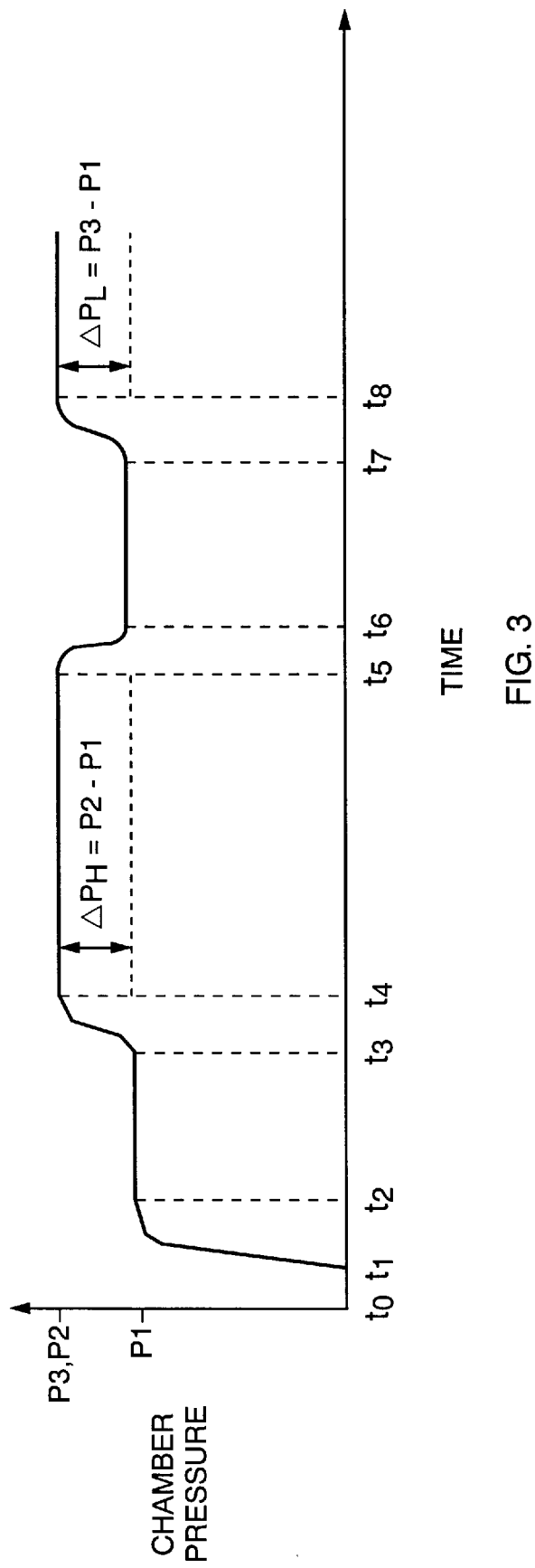
FIG. 3 is a graph of chamber pressure versus time useful in explaining the flow chart of FIG. 2.

In step 202, the mass flow controller 51 is directed by the controller 17 to flow helium carrier gas at a first rate (e.g., 1,600 sccm) (time $t_1$, in FIG. 3). The throttle valve 41 is adjusted so that the chamber pressure stabilizes at a background pressure (e.g., 6–8 Torr) of $P_1$ (time $t_2$). To compensate for hysteresis in the positioning mechanism (not shown) of the throttle valve 41, the throttle valve 41 preferably is adjusted as follows:

1. initially adjusting the throttle valve 41 to a position where the background pressure $P_1$ occurs and noting the position;
2. completely opening the throttle valve 41; and
3. returning the throttle valve 41 to the noted position where the background pressure $P_1$ occurs.

This procedure "rails" or zeros the throttle valve 41 prior to returning the throttle valve 41 to the noted position. As such, during subsequent calibration verification procedures, the throttle valve 41 can be placed in the exact same position every time (e.g., by zeroing the throttle valve 41 each time).

In step 203 (time $t_3$), the controller 17 directs the mass flow controller 51 to increase the flow rate of the helium carrier gas to a second flow rate. The pressure within the chamber then is allowed to stabilize (time $t_4$).

In step 204, the controller 17, via a pressure gauge (not shown) coupled to the chamber 27, measures the pressure ($P_2$) within the chamber 27 due to the increased helium flow rate. This occurs at some time between $t_4$ and $t_5$. The controller 17 then computes the pressure rise ($\Delta P_{HE}$) within the chamber 27 due to the increased helium flow rate as $\Delta P_{HE} = P_2 - P_1$.

In step 205 (time $t_5$), the flow rate of the helium carrier gas is returned to the first flow rate via the controller 17, and the pressure within the chamber 17 stabilizes at pressure $P_1$ (time $t_6$).

In step 206 (time $t_7$), the controller 17 directs the first liquid flow meter 45a to flow TEB at a first flow rate. The TEB flows from the first flow meter 45a to the first injection valve 47a where the TEB is vaporized by the helium carrier gas flowing at the helium's first flow rate. The vaporized TEB travels through the first gas line 53a and the second injection valve 47b, wherein no TEOS is vaporized as the second flow meter 45b is turned off, through the second gas line 53b and the third injection valve 47c, wherein no TEPO is vaporized as the third flow meter 45c is turned off, through the third gas line 53c, through the gas mixing box 21 and into the chamber 27. The press-re within the chamber 27 stabilizes at a pressure $P_3$ (time $t_8$)

In step 207, the controller 17 measures the pressure $P_3$ within the chamber 27 due to the TEB flow rate. This occurs at some time after time $t_8$. The controller 17 then computes the pressure rise ($\Delta P_{PL}$) within the chamber 27 due to the TEB processing liquid flow rate as $\Delta P_{PL} = P_3 - P_1$. Note that $P_2$ and $P_3$ are shown at the same height on the y-axis of FIG. 3 merely for convenience.

In step 208, the flow of TEB from the first flow meter 45a may be stopped if so desired.

In step 209, the pressure rise ratio (PRR) of the processing liquid pressure rise $\Delta P_{PL}$ to the helium carrier gas pressure rise $\Delta P_{HE}$ is computed as $PRR = \Delta P_{PL} / \Delta P_{HE}$. The reciprocal ratio ($\Delta P_{HE} / \Delta P_{PL}$) also can be used.

In step 210, the controller 17 determines if the calibration verification procedure has been previously performed for the first flow meter 45a. If the calibration verification procedure has not been previously performed for the first flow meter 45a (e.g., a first-time verification), control passes to step 211 (to store the PRR as a baseline PRR); otherwise control passes to step 212 (to compare the PRR to the stored baseline PRR).

In step 211, the pressure rise ratio is stored by the controller 17 as the baseline pressure rise ratio. All subsequently calculated pressure rise ratios are compared to the baseline PRR. Therefore, the baseline PRR preferably is determined immediately after the first flow meter 45a is calibrated to ensure the baseline PRR accurately represents the pressure rise caused by a properly calibrated flow meter. Control then passes from step 211 to step 216 wherein the calibration verification procedure ends.

In step 212, if the calibration verification procedure has been previously performed on the first flow meter 45a, the controller 17 compares the measured PRR to the baseline PRR for the first flow meter 45a. For instance, the percentage difference between the baseline PRR and the measured PRR is calculated.

In step 213, the controller 17 determines whether the difference between the measured PRR and the baseline PRR is within tolerance (e.g., preferably about 4%, depending on the application). Because mass flow controllers are more accurate and much more reliable than liquid flow meters, the flow rate of the helium carrier gas is unlikely to vary. As such, the pressure rise ratio will change only if the calibration of the first flow meter 45a changes such that a different amount of vaporized processing liquid flows into the chamber 27 during calibration verification. If the measured PRR is within tolerance of the baseline PRR, control passes to step 214; otherwise control passes to step 215.

In step 214, the controller 17 signals that the first liquid flow meter 45a is still properly calibrated. Therefore, a semiconductor processing step employing TEB supplied via the first flow meter 45a can be performed reliably and reproducibly. Control then passes to step 216 wherein the calibration verification procedure ends.

Alternatively, if the measured PRR is not within tolerance of the baseline PRR, in step 215 the controller 17 signals that the first liquid flow meter 45a is no longer calibrated properly and that semiconductor processing should not be performed using the first flow meter 45a. Preferably the first flow meter 45a is replaced, the new flow meter is calibrated and a baseline PRR is established for the new flow meter. Alternatively, the first flow meter 45a may be repaired, calibrated and a baseline PRR established for the repaired first flow meter 45a. Control then passes to step 216 wherein the calibration verification procedure ends.

The inventive calibration verification procedure advantageously relies only on pressure rises that occur within the chamber 27. Thus, between-chamber variations that affect pressure rise are irrelevant. Further, small variations within the chamber 27 which affect pressure rise but which have little affect on device processing within the chamber 27 do not cause the inventive calibration verification procedure to erroneously signal that a flow meter should be replaced. For instance, if the leak rate, pumping speed, throttle valve leakage rate, or degassing/absorption properties of the chamber 27 change slightly, both the processing liquid pressure rise and the helium carrier gas pressure rise will be similarly affected, and the pressure rise ratio will remain substantially constant. Additionally, the calibration verification procedure can be performed rapidly, with little chamber downtime and typically with existing semiconductor processing equipment.

Figure 4:
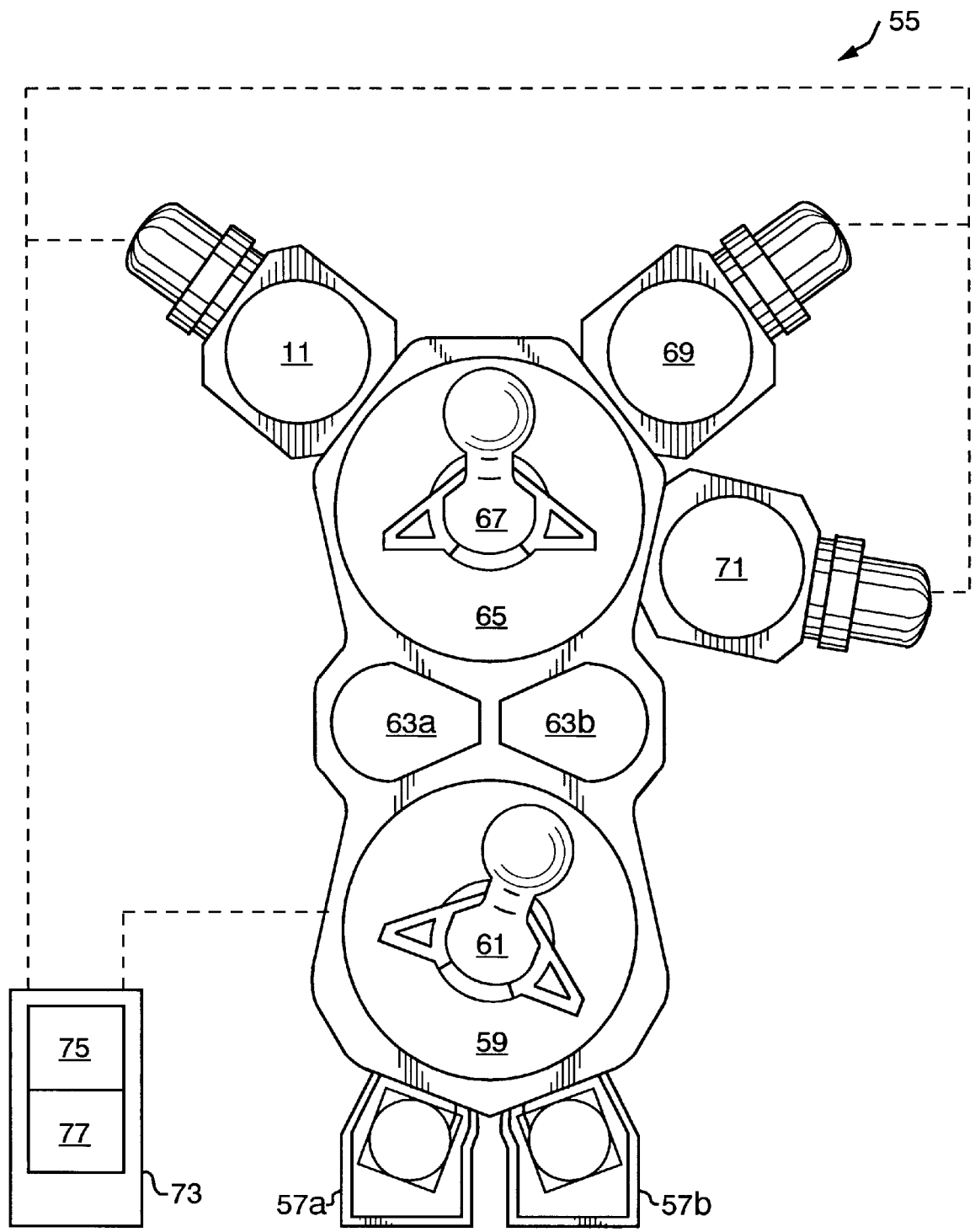
FIG. 4 is a top plan view of an automated tool for fabricating semiconductor devices programmed to perform the inventive calibration verification procedure of FIG. 2.

FIG. 4 is a top plan view of an automated tool 55 for fabricating semiconductor devices. The tool 55 comprises a pair of load locks 57a, 57b, and a first wafer handler chamber 59 containing a first wafer handler 61. The first wafer handler chamber 59 is operatively coupled to the pair of load locks 57a, 57b and to a pair of pass-through chambers 63a, 63b. The pair of pass-through chambers 63a, 63b are further coupled to a second wafer handler chamber 65, containing a second wafer handler 67. The second wafer handler chamber 65 and the second wafer handler 67 are coupled to a plurality of processing chambers 69, 71. Most importantly, the second wafer handler chamber 65 is coupled to the CVD system 11 of FIG. 1A. The entire tool 55 is controlled by a controller 73 (which comprises a microprocessor 75 and a memory 77) having a program therein which controls semiconductor wafer transfer among; the load locks 57a, 57b, the pass-through chambers 63a, 61b, the processing chambers 69, 71, and the CVD system 11, and which controls processing therein.

The controller program includes the inventive calibration verification procedure for verifying the calibration of all flow meters within the CVD system 11, as well as the flow meters feeding processing gasses/liquids to the chambers 69, 71. The overall configuration of the tool 55 is designed for optimal productivity. An improperly calibrated flow meter within such a tool is particularly costly, as it can affect the productivity of the entire tool 55, including the plurality of processing chambers contained therein. Thus, by employing the inventive calibration verification procedure, the value of the automated semiconductor processing tool increases significantly.

The foregoing description discloses only the preferred embodiments of the invention, modifications of the above disclosed apparatus and method which fall within the scope of the invention will be readily apparent to those of ordinary skill in the art. For instance, while the inventive calibration verification procedure has been explained within reference to CVD systems, it has similar applicability to other processing systems such as epitaxial growth systems, etch systems, physical vapor deposition systems and the like; and the inventive calibration verification procedure may be used to verify the calibration of any type of flow regulator.

Accordingly, while the present invention has been disclosed in connection with the preferred embodiments thereof, it should be understood that other embodiments may fall within the spirit and scope of the invention, as defined by the following claims.

The invention claimed is:

1. A method for verifying the calibration of semiconductor processing equipment comprising:

flowing an inert gas into a processing chamber at a selected flow rate to cause an inert gas pressure rise;

measuring the inert gas pressure rise;

flowing a processing gas at a first flow rate into the processing chamber to cause a processing gas pressure rise;

measuring the processing gas pressure rise; and comparing the processing gas pressure rise to the inert gas pressure rise.

2. The method of claim 1 wherein flowing an inert gas comprises flowing helium.

3. The method of claim 1 wherein flowing a processing gas comprises flowing a vaporized processing liquid.

4. The method of claim 3 wherein flowing a vaporized processing liquid comprises flowing a vaporized processing liquid selected from the group consisting of TEOS, TEPO and TEB.

5. A method of verifying the calibration of a processing gas flow regulator comprising:

performing the method of claim 1 by controlling the flow rate of the processing gas via the processing gas flow regulator.

6. The method of claim 1 wherein comparing the processing gas pressure rise to the inert gas pressure rise comprises computing a pressure rise ratio equal to the processing gas pressure rise divided by the inert gas pressure rise.

7. The method of claim 6 further comprising comparing a previously measured pressure rise ratio to a subsequently measured pressure rise ratio.

8. The method of claim 1 further comprising stopping the flow of the inert gas and allowing the pressure within the chamber to stabilize to a background pressure prior to flowing the processing gas.

9. The method of claim 1 further comprising stopping the flow of the processing gas prior to comparing the processing gas pressure rise to the inert gas pressure rise.

10. The method of claim 1 further comprising prior to flowing an inert gas:

evacuating the processing chamber to a base pressure;

flowing the inert gas at a first flow rate;

adjusting a throttle valve of the processing chamber so that a background pressure is reached; and wherein flowing an inert gas into a processing chamber at a selected rate comprises increasing the flow rate of the inert gas from the first flow rate to a second flow rate.

11. A method of calibrating a processing gas flow regulator comprising:

performing the method of claim 10 by controlling the flow rate of the processing gas via the processing gas flow regulator.

12. The method of claim 10 wherein adjusting a throttle valve of the processing chamber so that a background pressure is reached comprises:

adjusting the throttle valve via a throttle valve adjustment mechanism to a first position so that the background pressure is reached;

moving the throttle valve past the first position; and returning the throttle valve to the first position so as to compensate for hysteresis in the throttle valve adjustment mechanism.

13. The method of claim 10 wherein comparing the processing gas pressure rise to the inert gas pressure rise comprises computing a pressure rise ratio equal to the processing gas pressure rise divided by the inert gas pressure rise.

14. The method of claim 10 further comprising reducing the flow rate of the inert gas from the second flow rate to the first flow rate and allowing the pressure within the processing chamber to stabilize at the background pressure prior to flowing the processing gas.

15. An apparatus for verifying the calibration of semiconductor processing equipment, the semiconductor processing equipment having a vacuum chamber, a pressure gauge coupled to the vacuum chamber for measuring the pressure within the vacuum chamber, a processing gas source coupled to the vacuum chamber via a processing gas flow regulator, the processing gas flow regulator for regulating the flow rate of the processing gas flowing into the vacuum chamber, an inert gas source coupled to the vacuum chamber via an inert gas flow rate regulator, the inert gas flow rate regulator for regulating the flow rate of the inert gas flowing into the vacuum chamber, the apparatus comprising:

a controller for coupling to the pressure gauge, the controller programmed for:

measuring a pressure rise within the vacuum chamber due to the inert gas;

measuring a pressure rise within the vacuum chamber due to the processing gas; and comparing the processing gas pressure rise to the inert gas pressure rise.

16. The apparatus of claim 15 wherein the inert gas source comprises a helium source and wherein the inert gas flow regulator comprises a mass flow controller.

17. The apparatus of claim 15 wherein the controller further comprises:

a first control output for coupling to the inert gas flow rate regulator so as to regulate the flow rate of the inert gas into the vacuum chamber;

a second control output for coupling to the processing gas flow regulator so as to regulate the flow rate of the processing gas flowing into the vacuum chamber; and wherein the controller is further programmed for:

adjusting the flow rate of the inert gas into the vacuum chamber so as to cause the inert gas pressure rise; and adjusting the flow rate of the processing gas into the vacuum chamber so as to cause the processing gas pressure rise.

18. The apparatus of claim 17 wherein the controller further comprises a third control output for coupling to a throttle valve of the vacuum chamber and wherein the controller is further programmed for:

prior to adjusting the flow rate of the inert gas so as to cause the inert gas pressure rise:

allowing the vacuum chamber to pump to a base pressure;

adjusting the flow rate of the inert gas to a background rate; and adjusting the throttle valve of the vacuum chamber so that a background pressure is reached; and prior to adjusting the flow rate of the processing gas so as to cause the processing gas pressure rise:

adjusting the flow rate of the inert gas to the background rate; and allowing the pressure within the vacuum chamber to stabilize at the background pressure.

19. The apparatus of claim 15 wherein the controller is further programmed to compare the processing gas pressure rise to the inert gas pressure rise by computing a pressure rise ratio equaling the ratio of the processing gas pressure rise to the inert gas pressure rise.

20. The apparatus of claim 19 wherein the controller is further programmed to store a pressure rise ratio as a baseline pressure rise ratio and to compare subsequently measured pressure rise ratios to the baseline pressure rise ratio.

21. An automated semiconductor device fabrication tool comprising:

at least one load lock;

a wafer handler chamber coupled to the load lock, the wafer handler chamber having a wafer handler therein;

a plurality of processing chambers operatively coupled to the wafer handler and the wafer handler chamber; and the apparatus of claim 15 operatively coupled to one of the plurality of processing chambers.

* * * * *